(12) United States Patent
Dalton

(10) Patent No.: US 6,951,017 B1
(45) Date of Patent: Sep. 27, 2005

(54) DESIGN SYSTEM UPGRADE MIGRATION

(75) Inventor: Kenton T. Dalton, Fort Collins, CO (US)

(73) Assignee: LSI Logic Corporation, Milpitas, CA (US)

( * ) Notice: Subject to any disclaimer, the term of this patent is extended or adjusted under 35 U.S.C. 154(b) by 665 days.

(21) Appl. No.: 09/916,958

(22) Filed: Jul. 27, 2001

(51) Int. Cl.$^7$ .............................................. G06F 9/44
(52) U.S. Cl. ..................... 717/170; 717/115; 703/4; 716/11
(58) Field of Search ............................... 717/168–170, 717/115; 703/4; 716/11

(56) References Cited

U.S. PATENT DOCUMENTS 5,999,729 A * 12/1999 Tabloski et al. ............ 717/105
6,604,236 B1 * 8/2003 Draper et al. ............... 717/170
6,625,597 B1 * 9/2003 Yazdani ......................... 707/3

* cited by examiner

Primary Examiner—Kakali Chaki
Assistant Examiner—Lawrence Shrader
(74) Attorney, Agent, or Firm—Westman, Champlin & Kelly

(57) ABSTRACT

A software tool is created to migrate computer files that define ICs from older to newer computer-readable directory structures. The old and new directories are compared to identify differences that are mapped and sorted on the basis of directory source names. A computer file defining an IC is migrated by identifying source names in the file that are referenced by the tool. For each identified source name, the associated directory reference is changed from the old to the new directory structure.

20 Claims, 3 Drawing Sheets

DESIGN SYSTEM UPGRADE MIGRATION

FIELD OF THE INVENTION

This invention relates to upgrading design systems comprising tools that permit users to design application-specific integrated circuits (ASICs) using vendor technology, and particularly to migration of user scripts and files through revisions and upgrades of vendor design systems.

BACKGROUND OF THE INVENTION

ASICs are manufactured by ASIC vendors using vendor-proprietary semiconductor technology. The ASIC vendor often supplies its customers with an "ASIC design system" that includes a suite of tools, ASIC vendor data and methodologies/flows. The ASIC design system permits the customer to design integrated circuits (ICs) which, when fabricated using the ASIC vendor's technology, implements a functional design of the user. The ASIC design system includes a large number of model sets and associated procedures that enable the customer to employ widely available Electronic Design Automation (EDA) tools using the ASIC vendor's technology. Due to the large number and types of circuits that comprise an ASIC vendor's technology, the technology is ordinarily cataloged into functional groups, called "libraries". For example, a vendor may provide a Small Computer System Interface (SCSI) circuit library so customers can implement designs that conform to the SCSI input/output (I/O) standard.

The model sets that represent these technology libraries vary widely in format. Some model sets are text-based formats, some are binary, some include multi-circuit libraries, yet others represent single circuit models. These libraries are usually represented by a large number of directories that organize related files into groups. The directories represent the ASIC vendor's technology library groupings. Each directory contains a source name. The number of these directories, and the names assigned to each directory, are based on the ASIC vendor's technology library groupings. These directories are necessary due to the large amount of data that must be represented and the architecture of modern EDA tools that the design system must support.

Moreover, for increased design flexibility, it is beneficial to the customer that an ASIC vendor support as wide array of EDA tools as practical. As the number of EDA tools increases, the number of libraries, and the complexity of the associated directories, multiplies.

The high complexity of modern design tools, together with an increasingly complicated design system directory structure, require customers to frequently document design efforts by creating wrapper scripts and configuration files. Wrapper script and configuration files define the ASIC netlist and parameters in an executable log file that references file paths in the applicable ASIC design system. The netlists are technology dependent; that is, they represent the ASIC in terms of a specific technology system associated with an ASIC vendor. These scripts and files often make multiple references to various subdirectories and file paths within the library directory structure.

As ASIC vendors continue to develop and improve ASIC design systems, the need arises to change the file groupings and/or directory structure in order to implement new features or changes to the overall system. Changed groupings and file paths cause problems for existing users who have invested considerable effort into the creation of wrapper scripts and configuration files that reference file paths in the ASIC design system. These changes also create problems for the ASIC vendor because information concerning the changes often needs to be explicitly communicated to customers to guide them through the process of updating these embedded library references.

Currently, ASIC vendors introduce changes to ASIC design systems in either (or both) of two approaches. First, vendors might document the changes and assist customers in adjusting their environments manually. This approach requires the ASIC vendor to carefully document the changes, and it imposes an additional burden on the ASIC vendor's support staff to assist customers who did not read or understand the documentation. Moreover, documentation and manual adjustment to accommodate changes in the ASIC design system tends to be error-prone and time-consuming since the customer is forced to do updates manually based on documentation information.

A second approach for ASIC vendors is to make no changes to existing versions of the design system, but instead to introduce new versions of ASIC design systems as new releases. This approach suffers loss of flexibility, and creates an impediment on the ASIC vendor development team from making and implementing changes to library contents and from regrouping functional blocks as the technology offerings mature. Moreover, as the design system matures, new features are assigned to existing groups, rendering the library contents less logically grouped in subsequent versions. Consequently, later versions of the design system become more difficult for customers to use. More particularly, customers experience greater difficulty finding specific files and taking advantage of new offerings in subsequent releases of the design system.

SUMMARY OF THE INVENTION

In one embodiment of the invention, a software tool is created to migrate computer files that define ICs from older to newer computer-readable directory structures. The old and new directories are compared to identify differences. A computer-readable map file is generated containing a plurality of lines, with each line referencing a difference between the old and new directory structures. The lines are sorted into an ordered list based on source name. A computer-readable code, representing a modification between the old and new directory structures, is generated for each source name. The tool is generated based on the computer-readable codes, and is useable to migrate computer files from the old to the new directory structure.

In preferred embodiments, the tool script is packaged with the new computer-readable directory structure.

In another embodiment of the invention, the tool is used to migrate a computer file that defines an IC in the old directory structure to one that defines the IC in the new directory structure. The computer file is input to a computer containing the tool. The computer identifies source names that are referenced by the tool and appear in lines of the computer file. For each identified source name, the associated directory reference is changed from the old to the new directory structure.

In preferred embodiments, the lines containing a changed directory reference are stored to a second computer file. The second computer file is output as defining the IC in the new directory structure.

Another embodiment of the invention is a computer software tool that operates a computer to migrate a user's computer file defining an IC from an old to a new directory structure.

DETAILED DESCRIPTION OF THE PREFERRED EMBODIMENTS

The present invention is directed to techniques that aid in the migration of user scripts and configuration files to new revisions of the design system. The invention provides a tool that supports system updates and provides the framework to support future system updates.

ASIC customers define integrated circuits as wrapper script and configuration files that define the ASIC netlist and parameters that are technology dependent; that is, they represent the ASIC in terms of a specific technology system associated with an ASIC vendor. The specific ASIC design is often proprietary to the customer, whereas the specific technology system is usually proprietary to the vendor. The netlist is employed by the ASIC vendor to fabricate (manufacture) the ASIC chips for integration by the customer into a customer product. For example, the ASIC chip may be a customer-proprietary processor to be mounted on a circuit board as part of the customer's end product.

ASIC vendors often improve the technology system, resulting in improvements to the design system. ASIC customers often desire to take advantage of advances in the vendor's technology by upgrading, and hence improving, the customer's chip to incorporate new features in the vendor technology system. Moreover, as customer chip complexity increases, the chip design is exposed to new vendor technology and design system changes. To incorporate vendor technology into the customer chips, the customer's wrapper script and configuration files must be modified for compatibility to the modified technology system. Advanced netlists are generated from the modified wrapper script and configuration files for use by the ASIC vendor in fabricating the advanced ASIC chips.

Figure 1:
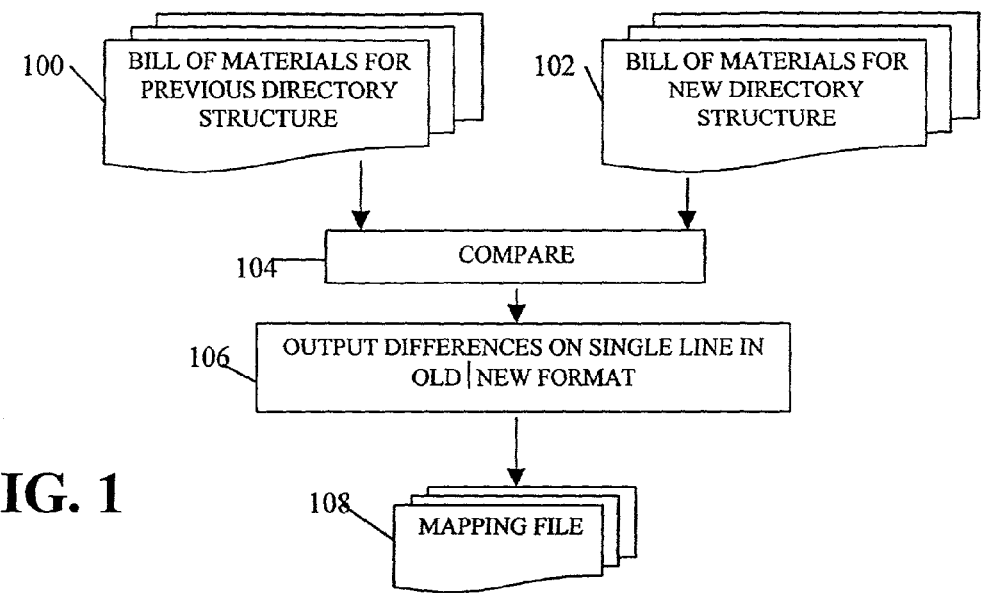
FIGS. 1 and 2 are flow charts of a process for developing a tool, according to an embodiment of the present invention, which is useful to migrate user scripts and files through revisions and upgrades of IC design systems.
Figure 2:
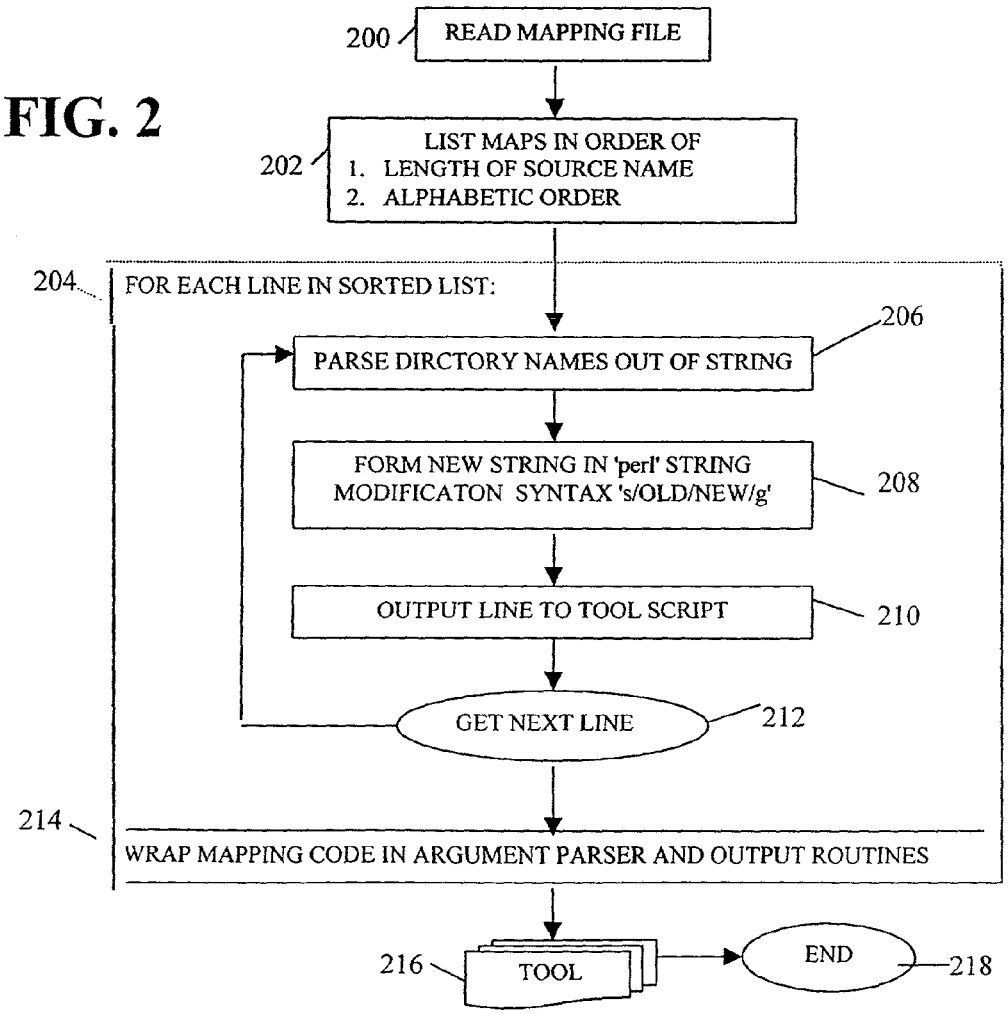
Figure 3A:
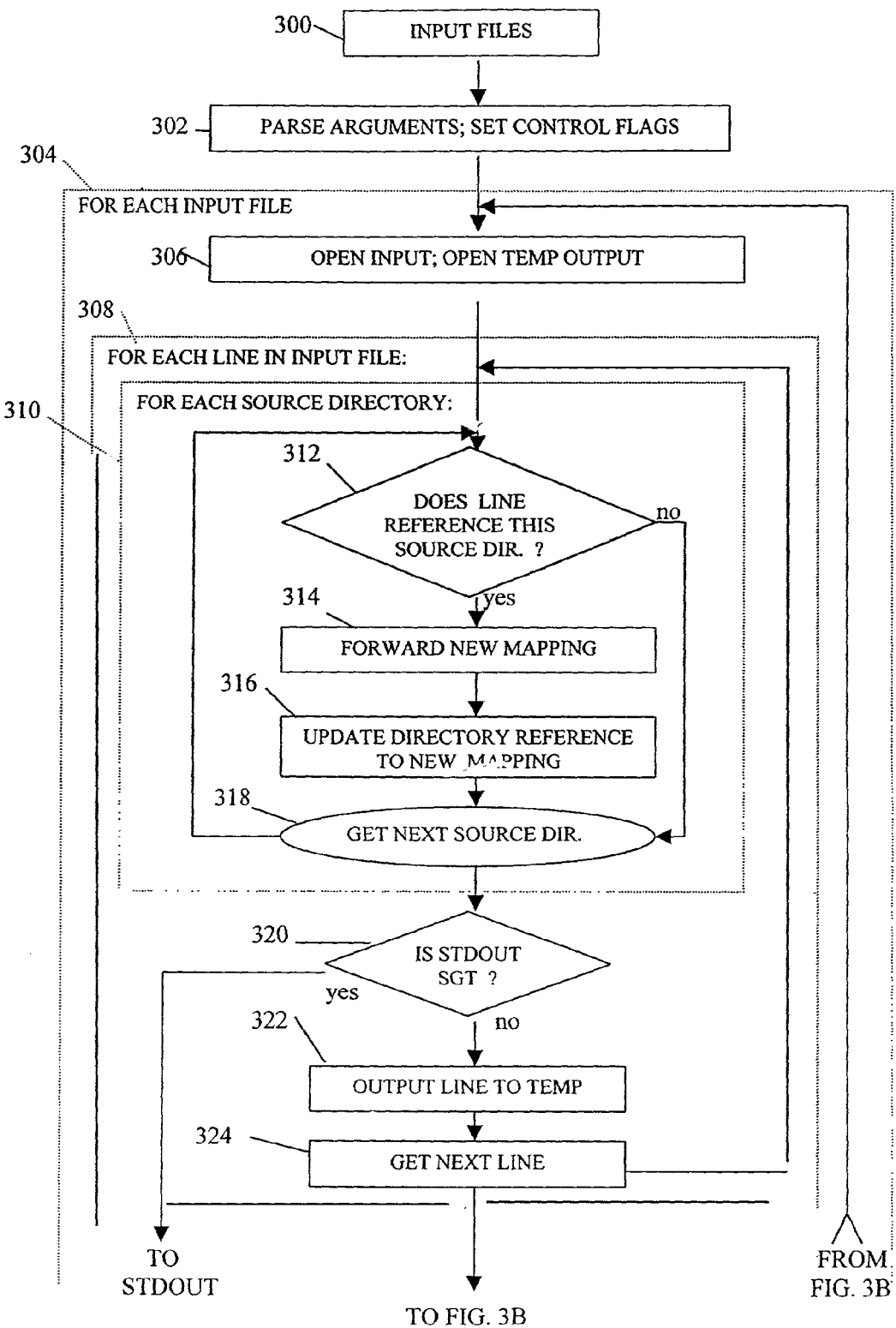
FIGS. 3A and 3B, taken together, is a flow chart of a migration process performed by the tool developed by the process of FIGS. 1 and 2 according to an embodiment of the present invention.
Figure 3B:
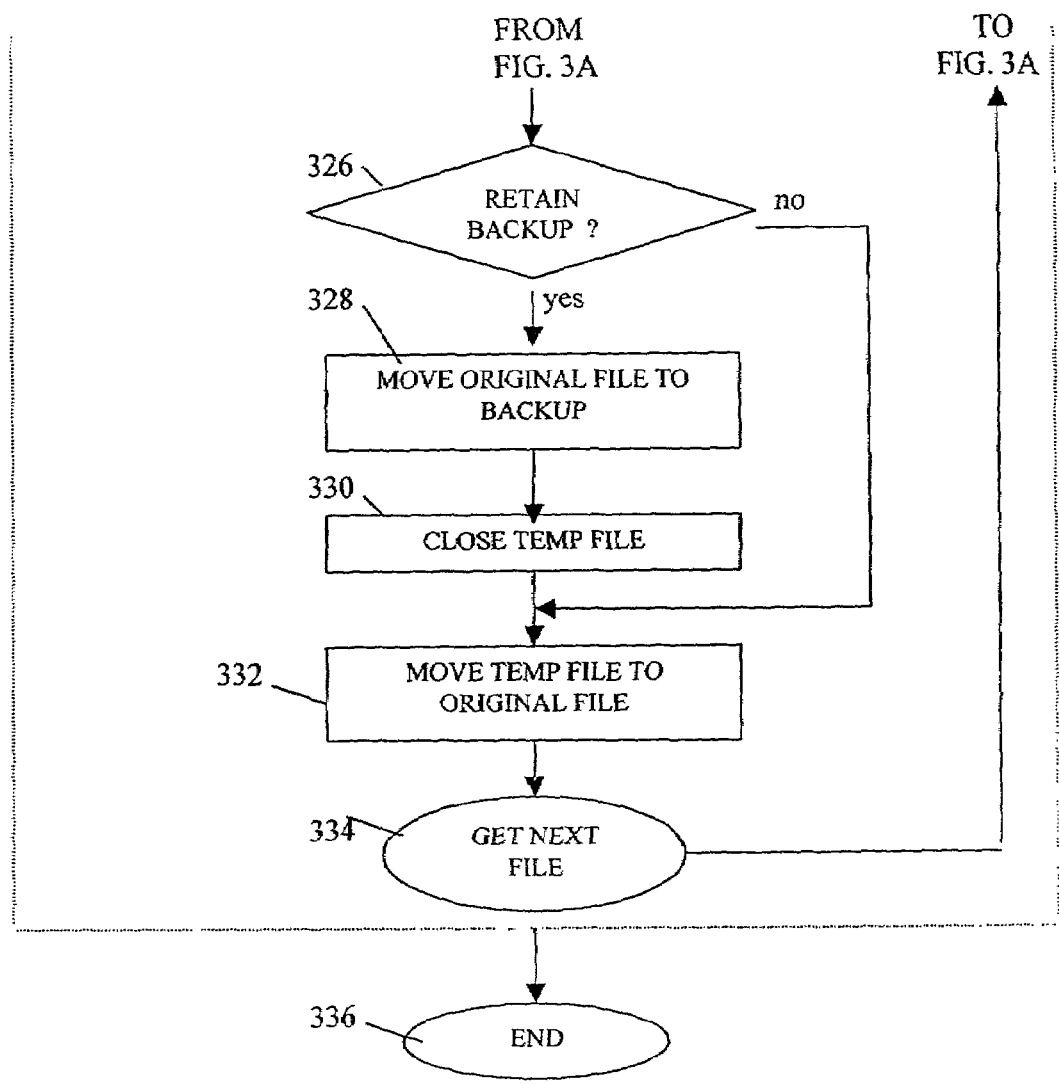

FIG. 1 is a flow chart illustrating steps performed by the ASIC vendor to generate a mapping file describing changes between revisions or releases of the vendor's IC design system. FIG. 2 is a flow chart illustrating steps performed by the ASIC vendor to develop a software tool that is useful to the users of the vendor's IC design system to migrate user script and files from the original to a new version or release of the IC design system. FIGS. 3A and 3B, when edge matched, is a flow chart illustrating the steps performed by the software tool under control of the user to migrate the user's script and files.

FIG. 1 illustrates the process performed by a computer to generate a mapping file that identifies differences between a previous directory structure and a current directory structure. Directory structures 100 and 102 are sequential versions or releases of the same ASIC design system. For example, the existing or previous directory structure of the ASIC design system might be version 2.0, whereas the new directory structure might be version 3.0 of the same ASIC design system. At steps 100 and 102, the computer readable version of the previous or existing directory structure and the computer readable version of the new directory structure are input to the computer. At step 104, the computer compares the two directory structures, and at step 106 the computer provides a line-by-line output identifying the differences between the two directories in old/new format. At step 108, the computer generates a computer readable mapping file. The mapping file includes a list of differences, with each item or map of the list referencing the applicable source name. The process of FIG. 1 is ordinarily performed using the same computer system as the ASIC design system. For example, the steps of FIG. 1 may be accomplished using a UNIX tool set.

The migration tool of the present invention is developed using the process illustrated in FIG. 2. Starting at step 200 where the mapping file created at step 108 is read, at step 202 the maps are sorted based on selected criteria. For example, in one preferred embodiment the items or maps are first sorted by the length of the source name referenced by the item or map, and second by alphanumeric order (such as alphabetic) of the source names of equal length.

At step 204, an iterative process is performed on each item or map of the sorted list. More particularly, for each line, at step 206 the directory name is parsed, and a new string, written in Perl, is created at step 208 having a modification syntax "S/OLD/NEW/g". The result identifies a relationship for the respective line item or map that represents a modification between the two input directory structures associated with the source names. The result is output to the tool script at step 210, and at step 212 the process loops back to step 206 for the next line or map of the sorted list. The process continues to iterate through steps 206–212 until all lines are generated representing the modifications between the old and new directories. At step 214, the mapping code is then wrapped into the argument parser and the routines are output to generate software tool 216, ending this part of the process at step 218.

While the processes of generating the mapping file (FIG. 1) and developing the migration tool (FIG. 2) are described as separate processes, it may be desirable to combine the processes and generate the mapping file as part of the development of the migration software tool.

The software tool created at step 216 is then tested for functionality and packaged with the ASIC design system whose directory structure was input at step 102. The package is then supplied to the user.

FIGS. 3A and 3B, taken together, illustrate the process performed by a computer under control of the software tool operated by the user to migrate user files from the previous or original ASIC design system to the new ASIC design system. At step 300, the user design files are input to the computer that contains the tool generated in FIG. 2. At step 302, the arguments are parsed, requiring a minimum of one input file, and control flags are set based on the requirements of the user. For example, a "DIRONLY" flag is set so only directory names are changed. If the DIRONLY flag is not set, library names will be changed without regard to the context in which they appear. A "STDOUT" flag indicates a standard system output for the migration file will be generated, and a "NOBAK" flag indicates that back-up of the original file is not to be retained. The setting or not setting of these flags by the user establishes the nature of the output files.

At step 304, an iterative process is performed on each input file. More particularly, at step 306, one of the input files is opened and a temporary file output is established. At step 308, an iterative process is performed on each line of the selected input file. This process commences with an iterative process at step 310 on each source directory within each line of each input file. More particularly, at step 312, the computer determines whether the line opened at the current iteration of step 308 references the source directory identified at step 310. If it does, the process continues to step 314 where the computer creates a map that identifies changed directory references in the line, based on the changes identified in the software tool corresponding to the referenced source name. The directory reference in the computer file is updated at step 316 based on the map from tool 216. At step 318 the next source directory is obtained, and the process loops back to step 312 for the next source directory. If, at step 312, the line does not reference the source directory, the process simply skips to step 318 for the next source directory. The process continues through the iterations of step 310 until all of the source directories of the line are updated, whereupon the process continues to step 320.

At step 320, if the STDOUT flag is set, the standard operating system file handle output is provided for the referenced source directory. If it is not set, at step 322 the line established by iterative process 310 is forwarded to the temporary output file opened at step 306, and at step 324 the process loops back to the beginning of process 306 for the next line of the input file.

The process continues to iterate through steps 308 and 310 until all of the source directories in each line of the input file have been updated. The process then continues to step 326 where the NOBAK flag is examined to determine whether the user desires to retain the original file as a back-up. By default, a backup file (extension ".bak") will be created that has the unmodified contents of the original file. If the original is to be retained as a back-up file, the original file is moved to a back-up file at step 328 and the temp file is closed at step 330. The updated temp file is then renamed as the new original file at step 332. If, at step 326, a back-up was not desired to be retained, then the temp file becomes the original file at step 332 without backing up through steps 328 and 330.

After moving the temp file to the original file, the next file is obtained at step 334, and the process loops back to step 306 where the selected next file and the temp output file is opened. The process continues to iterate through steps 304, 308 and 310 until each source directory in each line of each input file is updated, thereby completing the migration of the input files from the previous directory structure to the new directory structure, and the process ends at step 336.

Each input file that contains a reference to a directory path in the previous design system is modified to reference directory paths in the new or updated design system. More particularly, the software tool identifies directory names in the user script to modify the corresponding path references. In some cases, directories may be consolidated in the new design system. Consequently, some directories may have multiple references in the output of the modified script as the result of this consolidation. Most EDA tools can accept reference to the same directory more than once, although the tool may issue warnings of multiple path references.

The tool according to the present invention permits automation of customer migration to new design kits and provides the customer with the ability to automatically migrate data files with directory references without manual file edits. Consequently, ASIC vendor design teams can make design system library changes with minimal effort of implementation, and the need to document changes to the directory structure is minimized. The migration tool is generated by the ASIC vendor, thereby increasing reliability and consistent performance of the portion executed by customers. Errors in implementing file changes are minimized, and customer time and resources for maintenance and upgrade of local files is minimized.

The tool also provides the framework to support future design system updates. More particularly, ASIC developers may create design systems following conventions established by the software tool, thereby aiding in migration of user computer files to and through subsequent future updates.

While present embodiments contemplate automated development of the migration tool through the process of FIGS. 1 and 2, it would be possible to develop the software tool manually. This approach would have the disadvantage of increased likelihood of errors and support issues versus the automation implemented by this invention. Dropping the automated tool development also would create redundant development effort and therefore require more effort by the ASIC vendor to develop and maintain the customer executed converter over several design system releases.

Although the present invention has been described with reference to preferred embodiments, workers skilled in the art will recognize that changes may be made in form and detail without departing from the spirit and scope of the invention.

What is claimed is:

1. A process of generating a software tool that causes a computer to create computer files that define integrated circuits as a plurality of second computer-readable directories in a second directory structure based on a second version of an ASIC design system, the process comprising steps of:
   a) providing a plurality of first computer-readable directories arranged in a first directory structure based on a first version of an ASIC design system different from the second version;
   b) comparing the first and second computer-readable directories to identify differences between the first and second directory structures;
   c) generating a computer-readable map file containing a plurality of items, each referencing a difference between the first and second computer-readable directory structures by an associated source name;
   d) sorting the items of the mapping file into an ordered list based on the source names;
   e) for each source name, generating a computer-readable code representing a difference between the first and second computer-readable directory structures associated with the respective source name; and
   f) generating the software tool based on the computer-readable codes, the software tool being executable by a computer to cause the computer to respond to computer files that define the integrated circuit in the first directory structure to generate the computer files that define the integrated circuit in the second directory structure.

2. The process of claim 1, wherein step (c) further comprises steps of:
   c1) sorting the source names by length, and
   c2) after step (c1), alphanumerically sorting source names of equal length.

3. The process of claim 2, further comprising after step (c) and before step (d)
   f) parsing the source names.

4. The process of claim 3, further comprising steps of:
   f) packaging the tool with the second directory structure.

5. The process of claim 2, further comprising steps of:
   f) packaging the tool with the second directory structure.

6. The process of claim 1, further comprising after step (c) and before step (d)
   f) parsing the source names.

7. The process of claim 6, further comprising steps of:
f) packaging the tool with the second directory structure.

8. A computer process of generating a second computer file that defines an integrated circuit in second computer-readable directories of a second directory structure based on a second version of an ASIC design system using a first computer file that defines the integrated circuit in first computer-readable directories of a first directory structure, wherein the first computer file contains a plurality of lines at least some of which contain one or more source names referencing first computer-readable directories of a first directory structure, the process comprising steps of:
 a) providing a computer containing a software tool that maps directory references between a first directory structure and the second directory structure by source name;
 b) inputting the first computer file to the computer, wherein the first directory structure is based on a first version of an ASIC design system, which is different from the second version;
 c) identifying source names in a line of the first computer file that are referenced by the software tool; and
 d) for each identified source name, substituting a second directory associated with the identified source name for each first directory associated with the identified source name.

9. The process of claim 8, wherein step (c) is performed by steps of:
 c1) comparing the source names in the line to the source names identified by the software tool, and
 c2) selecting the directory reference in the first computer file associated with each source name in the line that matches a source name identified by the software tool.

10. The process of claim 9, further comprising steps of:
 e) storing the line containing a substituted directory reference to the second computer file, and
 f) repeating steps (c) and (d) for each line in the first computer file.

11. The process of claim 10, further comprising:
 g) output the second computer file as defining the integrated circuit in the second directory structure.

12. The process of claim 8, further comprising steps of:
 e) storing the line containing a changed directory reference to the second computer file, and
 f) repeating steps (c) and (d) for each line in the first computer file.

13. The process of claim 12, further comprising:
 g) output the second computer file as defining the integrated circuit in the second directory structure.

14. The process of claim 8, wherein the second computer file overwrites the first computer file.

15. A computer useable medium having a computer-readable software tool embodied therein for controlling a computer containing a first computer-readable file to create a second computer-readable file, wherein the first computer-readable file contains a plurality of lines, at least some of which contain one or more source names referencing directories of a first directory structure, the computer-readable software tool comprising:
 first computer-readable program code for causing the computer to identify source names in each line of the first computer-readable file, wherein the first computer-readable file defines an integrated circuit in the first directory structure containing first computer-readable directories based on a first version of an ASIC design system; and
 second computer-readable program code for causing the computer to substitute the directory reference associated with each source name from the first directory structure to a second directory structure to create the second computer-readable file, which define the integrated circuit in second computer-readable directories of the second directory structure based on a second version of an ASIC design system different from the first version.

16. The computer useable medium of claim 15, wherein the computer-readable software tool includes computer-readable data representing source names in the first and second computer-readable directory structures, and the first computer-readable program code further comprises:
 computer-readable program code for causing the computer to compare the source names in the line of the first computer-readable file to the source names represented by the computer-readable data, and
 computer-readable program code for causing the computer to select the directory reference in the first computer-readable file associated with each identified source name in the line.

17. The computer useable medium of claim 16, wherein the computer-readable software tool further comprises:
 computer-readable program code for causing the computer to store the line containing a changed directory reference to the second computer-readable file.

18. The computer useable medium of claim 17, wherein the computer-readable software tool further comprises:
 computer-readable program code for causing the computer to output the second computer-readable file as defining the integrated circuit in the second directory structure.

19. The computer useable medium of claim 15, wherein the computer-readable software tool further comprises:
 computer-readable program code for causing the computer to store the line containing a changed directory reference to a second computer-readable file.

20. The computer useable medium of claim 19, wherein the computer-readable software tool further comprises:
 computer-readable program code for causing the computer to output the second computer-readable file as defining the integrated circuit in the second directory structure.

* * * * *